(12) United States Patent
Reisinger et al.

(10) Patent No.: US 6,995,416 B2
(45) Date of Patent: Feb. 7, 2006

(54) MEMORY DEVICE FOR STORING ELECTRICAL CHARGE AND METHOD FOR FABRICATING THE SAME

(75) Inventors: Hans Reisinger, Grünwald (DE); Reinhard Stengl, Stadtbergen (DE); Herbert Schäfer, Höhenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 52 days.

(21) Appl. No.: 10/853,734

(22) Filed: May 26, 2004

(65) Prior Publication Data

US 2004/0262637 A1 Dec. 30, 2004

(30) Foreign Application Priority Data

May 27, 2003 (DE) .............................. 103 24 081

(51) Int. Cl.
*H01L 27/108* (2006.01)
*H01L 29/76* (2006.01)
*H01L 29/94* (2006.01)
*H01L 31/119* (2006.01)

(52) U.S. Cl. .................. 257/296; 257/300; 977/DIG. 1
(58) Field of Classification Search .................. None
See application file for complete search history.

(56) References Cited

U.S. PATENT DOCUMENTS

| | | | | |
|---|---|---|---|---|
| 5,561,310 A | 10/1996 | Woo et al. | ................ | 257/306 |
| 6,297,063 B1 | 10/2001 | Brown et al. | ................ | 438/2 |
| 6,361,861 B2 | 3/2002 | Gao et al. | ................ | 428/367 |
| 6,515,325 B1 | 2/2003 | Farnsworth et al. | ........ | 257/296 |
| 6,740,910 B2 * | 5/2004 | Roesner et al. | ............. | 257/213 |
| 2003/0064583 A1 | 4/2003 | Kim et al. | ................... | 438/665 |
| 2003/0100189 A1 | 5/2003 | Lee et al. | ................... | 438/694 |
| 2003/0148562 A1 | 8/2003 | Luyken et al. | .............. | 438/197 |

FOREIGN PATENT DOCUMENTS

| | | |
|---|---|---|
| DE | 100 32 370 C1 | 12/2001 |
| WO | WO 99/25652 | 5/1999 |

OTHER PUBLICATIONS

Paul L. McEuen et al., "Single-Walled Carbon Nanotube Electronics," IEEE Transactions on Nanotechnology, vol. 1, No. 1 Mar. 2002.
H. Dai, "Surface Science 500," Carbon Nanotubes: Opportunities and Challenges, pp. 218-241.
H. Reisinger et al. "Fundamental Scaling Laws of DRAM Dielectrics," Proceedings of the 2000 Third IEEE International Caracas Conference on Devices, Circuits and Systems, Mar. 15-17, 2000, D26/1-D26/4.
B. El-Kareh et al. "The Evolution of DRAM Cell Technology," Solid State Technology, May 1997, Bd. 40, No. 5, pp. 89-101.

* cited by examiner

*Primary Examiner*—Tu-Tu Ho
(74) *Attorney, Agent, or Firm*—Morrison & Foerster LLP

(57) ABSTRACT

The invention provides a memory device for storing electrical charge, which has, as memory elements, tube elements applied on an electrode layer and connect-connected thereto. The tube elements are provided with a dielectric coating, a filling material for filling the space between the tube elements being provided. A counter-electrode connected to the filling material is formed such that an electrical capacitor for storing electrical charge is formed between the electrode layer and the counter-electrode. The tube elements advantageously comprise carbon nanotubes, as a result of which the capacitance of the capacitor on account of a drastic increase in the area of the capacitor electrode surface.

43 Claims, 4 Drawing Sheets

MEMORY DEVICE FOR STORING ELECTRICAL CHARGE AND METHOD FOR FABRICATING THE SAME

CLAIM FOR PRIORITY

This application claims the benefit of priority to German Application No. 103 24 081.0, filed on May 27, 2003 in the German language, the contents of which are hereby incorporated by reference.

TECHNICAL FIELD OF THE INVENTION

The present invention relates to memory devices, structures and fabrication methods for DRAM (Dynamic Random Access Memory) capacitors, and in particular, to a memory device for storing electronic charge. The invention also relates to a method for fabricating the memory device for storing electrical charge.

BACKGROUND OF THE INVENTION

Memory devices for storing electrical charge are of considerable importance in DRAM technology, stacked capacitors, in particular having become widely used in this case. A storage capacitance of about 30 fF (femtofarads) is necessary, for instance, for DRAMs in the region of 4 gigabits or more. Conventionally, a basic area of typically 100×100 nm$^2$ (nanometers$^2$) is available for such a capacitance. In order to be able to realize the required capacitance on such a basic area, electrodes with an aspect ratio of greater than 100 are required with the customary materials for dielectrics. It is disadvantageous that such structures with such high aspect ratios made of silicon are mechanically unstable.

The document "Fundamental scaling laws of DRAM dielectrics", by Reisinger, H.; Stengl, R., published in Proceedings of the 2000 Third IEEE International Caracas Conference on Devices, Circuits and Systems (Cat. No. 00TH8474), ISBN 0-7803-5766-3 publishes fundamental scaling laws of DRAM dielectrics. It is known according to the prior art that a relative permittivity must not exceed the value of 500 to 1000. For this reason, limits are disadvantageously imposed on increasing a storage capacitance through an increase in the relative permittivity of the dielectric of the storage capacitor of a memory device. In particular, the voltage across the memory cell limits an increase in the relative permittivity.

In order to increase the storage capacitance, it has been proposed to provide electrodes having an aspect ratio of greater than 100. It is disadvantageous that structures with such high aspect ratios are mechanically unstable.

Furthermore, it has been proposed to provide trench capacitors as capacitors of the memory device. The document "B. El-Kareh et al., The Evolution of DRAM cell technology, May 1997, Solid State Techn., pp. 89–101", which is incorporated by reference, describes conventional semiconductor memory cells and the evolution thereof, in part with the use of trench capacitors. It is disadvantageous that the devices and structures described in the document do not provide structures with a high aspect ratio. A capacitance for storing electrical charge is limited in this way.

SUMMARY OF THE INVENTION

The present invention relates to memory devices, structures and fabrication methods for DRAM (Dynamic Random Access Memory) capacitors, and relates in particular to a memory device for storing electronic charge, in which a storage density is increased compared to conventional memory devices. Furthermore, the invention relates to a method for fabricating the memory device for storing electrical charge.

The present invention provides a memory device for storing electrical charges in which a storage capacitance relative to a basic area is increased compared to conventional devices.

In one embodiment of the invention, elevated structures with a high aspect ratio and a high conductivity by using selectively applied tube elements in order thereby to increase an available storage capacitance per available basic area. According to the invention, the elevated tube elements are advantageously coated with a suitable dielectric.

One essential advantage of the present invention is that conventional fabrication methods for selectively grown tube elements or carbon nanotubes (CNT) can be used for fabricating a stacked capacitor element.

In another embodiment of the invention, there is a memory device for storing electrical charge includes:
 a) a substrate;
 b) at least two doping regions embedded in the substrate;
 c) at least one gate dielectric for connecting two adjacent doping regions;
 d) at least one word line applied on the at least one gate dielectric;
 e) a node contact-making element for connecting the word line to a barrier layer;
 f) an electrode layer deposited on the barrier layer,
 g) tube elements applied on the electrode layer and contact-connected thereto;
 h) a dielectric coating, with which the tube elements are coated;
 i) a filling material for filling the space between the tube elements; and
 j) a counterelectrode, which is connected to the filling material and is arranged in such a way that an electrical capacitor for storing electrical charge is formed between the electrode layer and the counterelectrode.

In still another embodiment of the invention, there is a method for fabricating a memory device for storing electrical charge including:
 a) providing a substrate;
 b) embedding at least two doping regions in the substrate;
 c) applying at least one gate dielectric for connecting two adjacent doping regions;
 d) applying at least one word line on the at least one gate dielectric;
 e) providing a node contact-making element for connecting the word line to a barrier layer;
 f) depositing an electrode layer on the barrier layer,
 g) applying and contact-connecting tube elements on the electrode layer;
 h) coating the tube elements with a dielectric coating;
 i) filling the space between the tube elements with a filling material; and
 j) connecting a counterelectrode to the filling material in such a way that an electrical capacitor for storing electrical charge is provided between the electrode layer and the counterelectrode.

In accordance with one preferred embodiment of the present invention, the substrate is formed from a p-conducting silicon material.

In accordance with yet another preferred embodiment of the present invention, the doping regions embedded in the substrate are formed as highly doped n-conducting regions, preferably as $n^{++}$-type regions.

In accordance with yet another preferred embodiment of the present invention, the doping of the doping regions embedded in the substrate is more than $10^{20}$ cm$^{-3}$.

In accordance with yet another preferred embodiment of the present invention, the doping regions embedded in the substrate are provided as drain and source regions of the memory device, a pair of drain and source regions together with the gate dielectric and the word line forming a field-effect transistor FET of the memory device.

In accordance with yet another preferred embodiment of the present invention, the node contact-making element for connecting the word line to the barrier layer is formed from polysilicon or tungsten.

In accordance with yet another preferred embodiment of the present invention, the barrier layer is preferably embodied from an electrically conductive material, preferably from titanium nitride (TiNi).

In accordance with yet another preferred embodiment of the present invention, the electrode layer deposited on the barrier layer is formed from a conductive element; the electrode layer preferably comprises aluminum.

In accordance with yet another preferred embodiment of the present invention, the tube elements applied on the electrode layer and electrically conductively connected thereto are provided as carbon nanotubes, i.e. as CNT elements (CNT=carbon nanotubes).

In accordance with yet another preferred embodiment of the present invention, the carbon nanotubes (CNT) are preferably produced from growth nuclei comprising ink.

The ink advantageously comprises a material having the composition Fe(NO$_3$)3*9H$_2$O. It is expedient for the tube elements or the CNT elements, i.e. the carbon nanotubes, to be coated with a metallization layer in order to provide a good electrical conductivity with the surroundings.

In accordance with yet another preferred embodiment of the present invention, a filling material for filling the space between the tube elements and the electrode layer is provided as an electrically conductive material in order to make contact with the tube elements.

It is advantageous that the filling material for filling the space between the tube elements comprises polysilicon or titanium nitride (TiNi).

In accordance with yet another preferred embodiment of the present invention, the dielectric coating with which the tube elements are coated comprises a material having a high relative permittivity.

Furthermore, the dielectric coating may expediently be provided from a material comprising aluminum oxide (Al$_2$O$_3$). In accordance with yet another preferred development of the present invention, the counterelectrode connected to the filling material is put at a ground potential, so that a connection of all the storage capacitors is at a common potential, i.e. the ground potential.

In accordance with yet another preferred embodiment of the present invention, the tube elements applied on the electrode layer and contact-connected thereto have an axis of symmetry that is perpendicular to the electrode layer.

The tube elements are preferably deposited in a straight form or in a "zigzag" form by means of chemical vapor deposition (CVD).

In accordance with yet another preferred embodiment of the present invention, growth nuclei for the carbon nanotubes that are to be applied on the electrode layer and contact-connected thereto are applied by means of a stamp device.

In accordance with yet another preferred embodiment of the present invention, the stamp device is provided as a plastic stamp. The plastic stamp preferably comprises polydimethylsiloxane. It is advantageous if the stamp device is pulled as a blank from a silicon substrate which has previously been patterned by means of electron beam lithography or by an STM (scanning tunneling microscope). In accordance with yet another preferred embodiment of the present invention, the carbon nanotubes that are formed from growth nuclei and are to be applied on the electrode layer and contact-connected thereto are deposited by means of a chemical vapor deposition method.

BRIEF DESCRIPTION OF THE INVENTION

Exemplary embodiments of the invention are illustrated in the drawings and explained in more detail in the description below.

In the drawings.

In the figures, identical reference symbols designate identical or functionally identical components or steps.

DETAILED DESCRIPTION OF THE INVENTION

Figure 1:
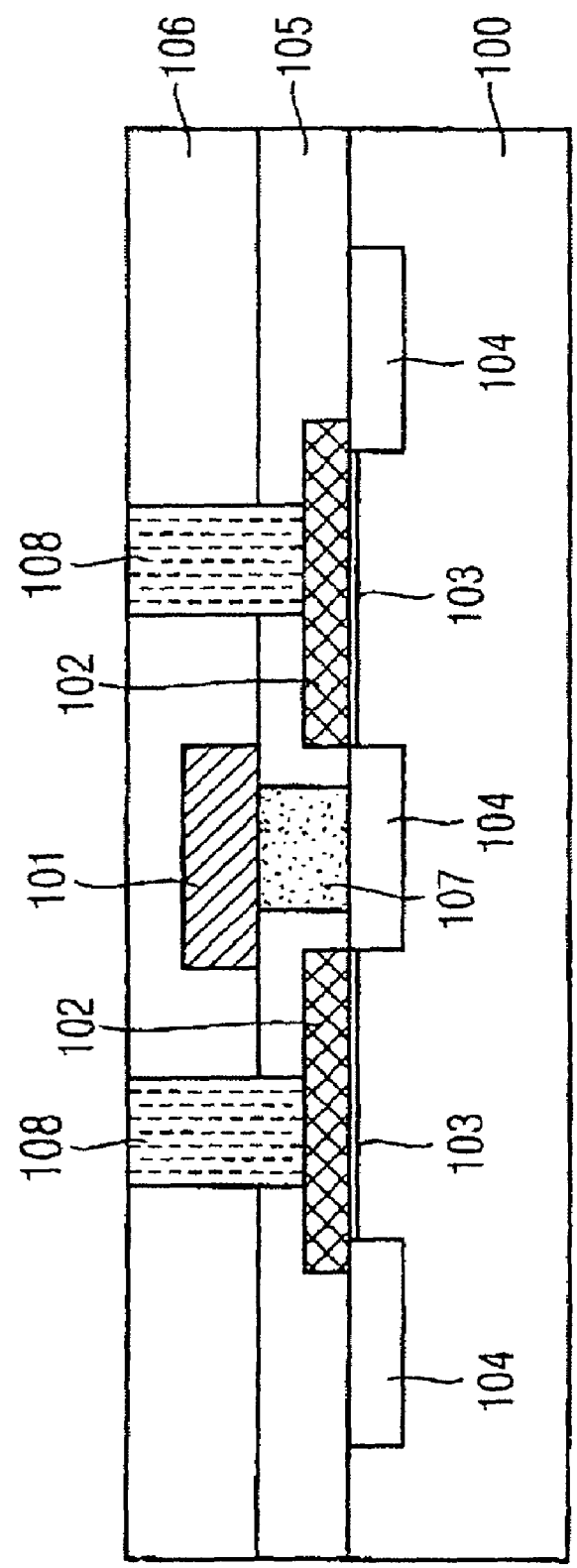
FIG. 1 shows a first step of a process sequence for fabricating a memory device for storing electrical charge in accordance with a preferred exemplary embodiment of the present invention.

FIG. 1 shows a substrate 100, preferably comprising a p-conducting material. Doping regions 104 are introduced into the substrate 100, the doping regions preferably having a high n-type doping ($n^{++}$-type doping). The doping regions form drain and source regions of a memory cell FET in the memory cell arrangement. A gate dielectric 103 is situated between two adjacent doping regions 104, the doping regions 104 being connected to said gate dielectric.

A respective word line is applied above the dielectric. The word line serves for applying externally predeterminable signals to the memory device. A first oxide layer 105, applied by means of chemical vapor deposition, covers the word lines 102 onto a respective node contact-making element 108 and a bit line contact-making element 107.

A bit line 101, which likewise provides for externally predeterminable signals to be applied to the memory device, is contact-connected on the bit line contact-making element 107. A second oxide layer 106, which is likewise applied by a chemical vapor deposition method, i.e. by means of a CVD method, covers the bit line 101, the two node contact-making elements 108 illustrated in FIG. 1 remaining accessible from outside.

The step of applying barrier and electrode layers and of providing growth nuclei for the carbon nanotubes will be explained in more detail next with reference to FIG. 2.

Figure 2:
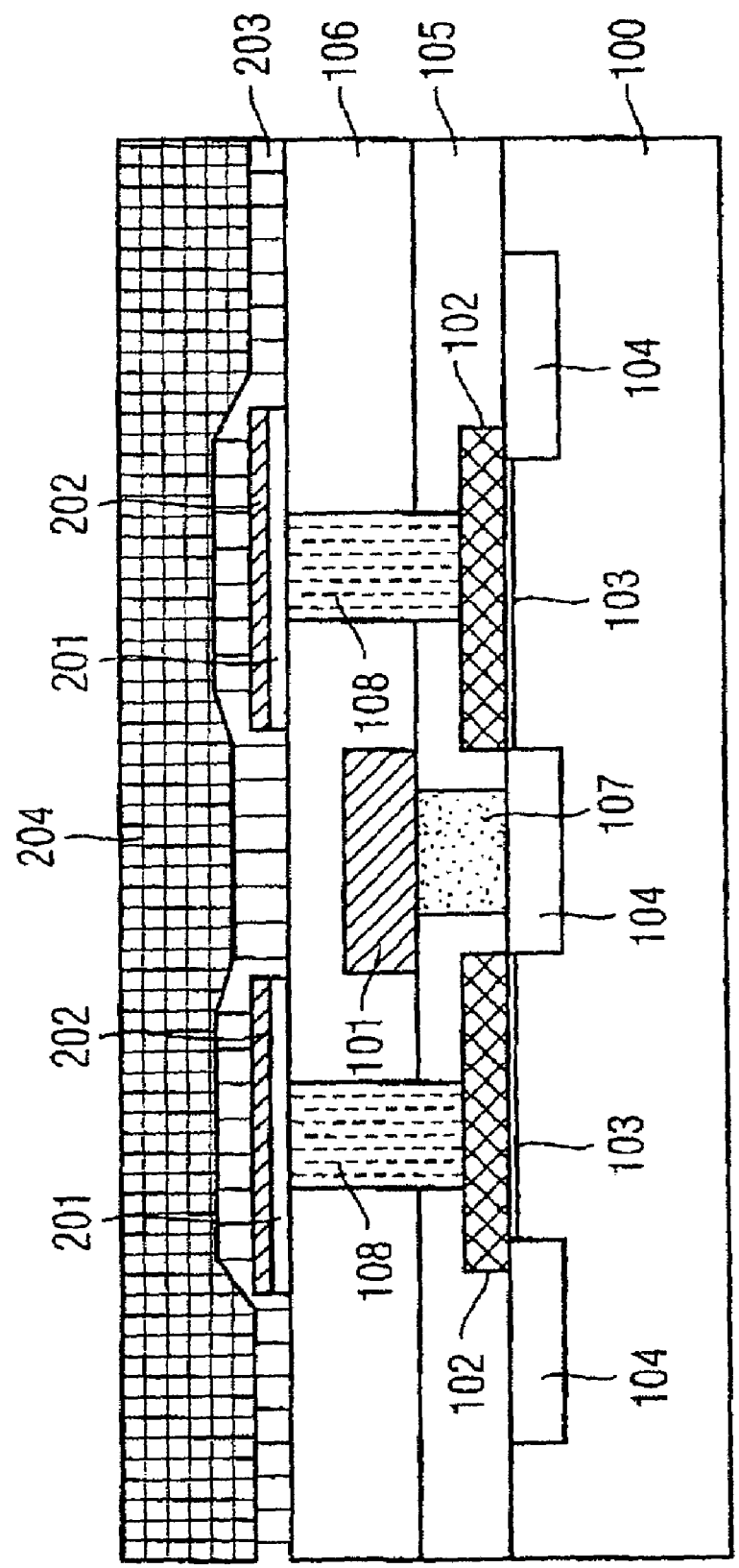
FIG. 2 shows the step of applying growth nuclei by means of a stamp device to the memory device fabricated in accordance with the step shown in FIG. 2.

FIG. 2 shows one of the barrier layers 201 respectively applied on the surface of the second oxide layer 106 in the region of the node contact-making element 108. The barrier layers 0 preferably comprise an electrically conductive material, preferably a titanium nitride—TiNi. Electrode layers 202 are in each case applied to the barrier layers 201, which electrode layers may comprise polysilicon or a metal such as, for example, aluminum.

The memory device thus prepared and illustrated in FIG. 2 is then provided with growth nuclei for growth of carbon nanotubes. In this case, a stamp device 204 having a stamp structure 203 is dipped into an ink, for example made of $Fe(NO_3)3*9H_2O$, large regions of the DRAM wafer then being covered with growth centers or growth nuclei for the carbon nanotubes.

Finally, the carbon nanotubes are deposited in a zigzag or in a straight form by means of a chemical vapor deposition method (CVD method). In this case, the deposition height of the carbon nanotubes depends on the diameter and the number of the carbon nanotubes per unit area.

Since the carbon nanotubes are provided with a dielectric in order to form a capacitor structure, the following dimensions can be specified for a typical dielectric thickness of 3 nm and a typical relative permittivity of $\epsilon=4$ in order to provide for example a capacitance of 30 fF (femtofarads):
  (i) 100 carbon nanotubes having a diameter of 10 nm require a height of 1 $\mu$m;
  (ii) 1 carbon nanotube having a diameter of 100 nm requires a height of 10 $\mu$m; and
  (iii) 10 carbon nanotubes having a diameter of 25 mm require a height of 4 $\mu$m.

Figure 3:
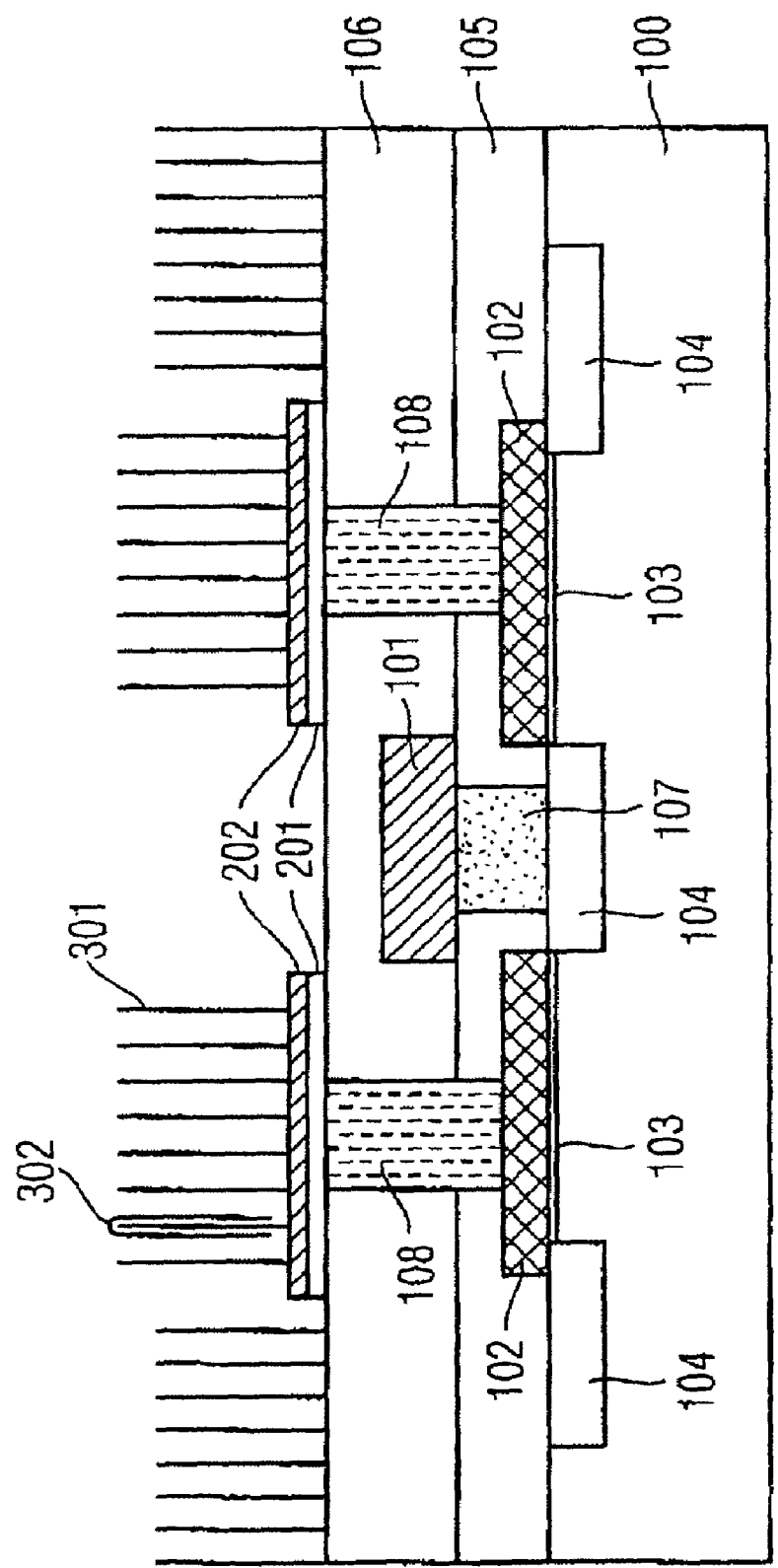
FIG. 3 shows the step of depositing carbon nanotubes on the arrangement shown in FIG. 2.

FIG. 3 shows the step of the method for fabricating the memory device after the carbon nanotubes 301 have been deposited. After the deposition of the carbon nanotubes or the tube elements 301, the latter are provided with a dielectric coating 302.

It should be pointed out that, prior to coating with a dielectric material, the carbon nanotubes may additionally be coated with a metal coating in order to further increase the conductivity. The metal coating may comprise for example ruthenium having a layer thickness of 3 nm. The dielectric may comprise, on the one hand, $Al_2O_3$, i.e. aluminum oxide having a low relative permittivity or a material having a high relative permittivity in accordance with the aspect ratios specified above.

Figure 4:
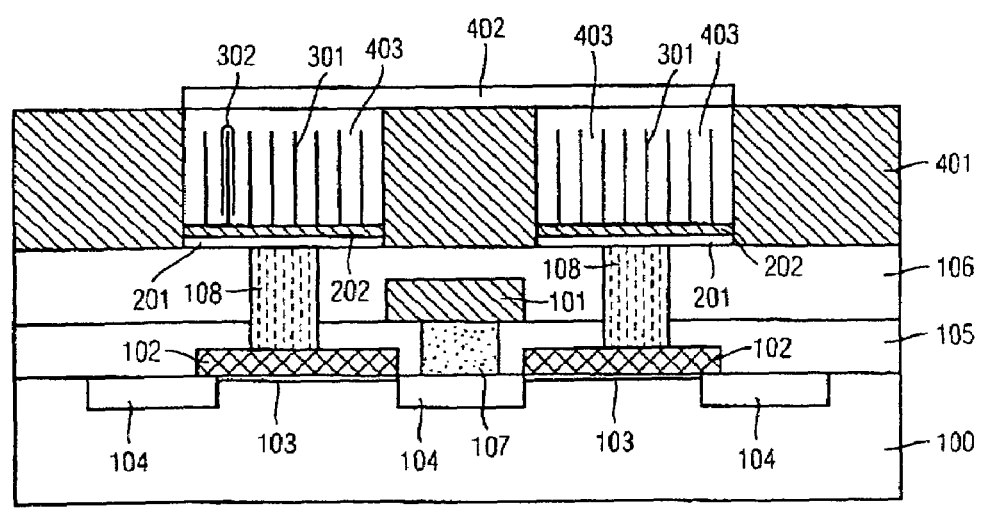
FIG. 4 shows the step of making contact with the carbon nanotubes in order to form storage capacitances of the memory device.

Finally, FIG. 4 shows the completion of the memory cell arrangement by the provision of filling material 403 which is introduced into the space between the tube elements 301. The filling material is provided as an electrically conductive material and is preferably embodied from titanium nitride TiNi. The filling material above the electrode layer 202 is delimited and insulated from its lateral surroundings by an applied third oxide layer 401.

As the final fabrication step, a counterelectrode 402 is applied, which makes contact with the filling material 403. By way of example, the counterelectrode 402 may be formed such that it is common to all the memory cells, as illustrated in FIG. 4. However, the invention is not restricted to a common counterelectrode 402; rather, the counterelectrode 402 may, as required, be split into individual counterelectrode elements. The counterelectrode 402 is preferably connected to ground.

The fabrication method according to the invention thus makes it possible to provide sufficient storage capacitances on a predetermined, extremely small basic area. The storage capacitance is increased compared with conventional methods because elevated structures are formed which increase an area of the corresponding capacitor elements.

In particular, it is advantageous to form tube elements 301 as carbon nanotubes and in this case to use known fabrication methods for carbon nanotubes. The use of carbon nanotubes permits the surface area of the electrode opposite to the counterelectrode to be drastically increased on account of the extremely small dimensions of the nanotubes, i.e. in the nanometers range. Furthermore, it is advantageous that a disadvantageous increase in the relative permittivity can be avoided as a result of the drastic increase in the area of the storage capacitors.

Although the present invention has been described above on the basis of preferred exemplary embodiments, it is not restricted thereto, but rather can be modified in diverse ways.

Moreover, the invention is not restricted to the application possibilities mentioned.

LIST OF REFERENCE SYMBOLS

In the figures, identical reference symbols designate identical or functionally identical components or steps.
100 substrate
101 bit line
102 word line
103 gate dielectric
104 doping region
105 first oxide layer
106 second oxide layer
107 bit line contact-making element
108 node contact-making element
201 barrier layer
202 electrode layer
203 stamp structure
204 stamp device
301 tube elements
302 dielectric coating
401 third oxide layer
402 counterelectrode
403 filling material
CNT carbon nanotube
CVD chemical vapor deposition

What is claimed is:

1. A memory device for storing electrical charges, comprising:
    a substrate;
    at least two doping regions embedded in the substrate;
    at least one gate dielectric for connecting two adjacent doping regions;
    at least one word line applied on the at least one gate dielectric;
    a node contact-making element for connecting the word line to a barrier layer;
    an electrode layer deposited on the barrier layer;
    tube elements applied on the electrode layer and contact-connected thereto;
    a dielectric coating, with which the tube elements are coated;
    a filling material for filling the space between the tube elements; and
    a counter-electrode, which is connected to the filling material and is arranged such that an electrical capacitor for storing electrical charge is formed between the electrode layer and the counter-electrode.

2. The device according to claim 1, wherein the substrate is formed from a p-conducting silicon material.

3. The device according to claim 1, wherein the doping regions embedded in the substrate are formed as highly doped n-conducting regions.

4. The device according to claim 3, wherein the doping of the doping regions embedded in the substrate is more than $10^{20}$ $cm^{-3}$.

5. The device according to claim 1, wherein the doping regions embedded in the substrate are provided as drain and source regions of the memory device.

6. The device according to claim 1, wherein the node contact-making element for connecting the word line to the barrier layer is formed from polysilicon.

7. The device according to claim 1, wherein the node contact-making element for connecting the word line to the barrier layer is formed from tungsten.

8. The device according to claim 1, wherein the barrier layer is formed from an electrically conductive material.

9. The device according to claim 1, wherein the electrode layer deposited on the barrier layer is formed from aluminum.

10. The device according to claim 1, wherein the tube elements applied on the electrode layer and contact-connected thereto are carbon nanotubes.

11. The device according to claim 10, wherein the carbon nanotubes applied on the electrode layer and contact-connected thereto are provided by growth nuclei comprising ink.

12. The device according to claim 11, wherein the carbon nanotubes applied on the electrode layer and contact-connected thereto are formed from growth nuclei of $Fe(NO_3)_3 * 9H_2O$ ink.

13. The device according to claim 1, wherein the tube elements are coated with a metallization layer.

14. The device according to claim 1, wherein the filling material for filling the space between the tube elements is an electrically conductive material.

15. The device according to claim 14, wherein the filling material for filling the space between the tube elements comprises polysilicon or a titanium nitride.

16. The device according to claim 1, wherein the dielectric coating with which the tube elements are coated comprises a material having a high relative permittivity.

17. The device according to claim 1, wherein the dielectric coating with which the tube elements are coated comprises aluminum oxide.

18. The device according to claim 1, wherein the counter-electrode connected to the filling material is at ground potential.

19. The device according to claim 1, wherein the tube elements applied on the electrode layer and contact-connected thereto have an axis of symmetry that is perpendicular to the electrode layer.

20. A method for fabricating a memory device for storing electrical charges, comprising:
providing a substrate;
embedding at least two doping regions in the substrate;
applying at least one gate dielectric for connecting two adjacent doping regions;
applying at least one word line on the at least one gate dielectric;
providing a node contact-making element for connecting the word line to a barrier layer;
depositing an electrode layer on the barrier layer;
applying and contact-connecting tube elements on the electrode layer;
coating the tube elements with a dielectric coating;
filling the space between the tube elements with a filling material; and
connecting a counter-electrode to the filling material such that an electrical capacitor for storing electrical charge is formed between the electrode layer and the counter-electrode.

21. The method according to claim 20, wherein the substrate is provided from a p-conducting silicon material.

22. The method according to claim 20, wherein the doping regions embedded in the substrate are formed as highly doped n-conducting regions.

23. The device according to claim 3, wherein the doping of the doping regions embedded in the substrate is set to more than $10^{20}$ $cm^{-3}$.

24. The method according to claim 20, wherein the doping regions embedded in the substrate are provided as drain and source regions of the memory device.

25. The method according to claim 20, wherein the node contact-making element for connecting the word line to the barrier layer is embodied from polysilicon.

26. The method according to claim 20, wherein the node contact-making element for connecting the word line to the barrier layer is embodied from tungsten.

27. The method according to claim 20, wherein the barrier layer is formed from an electrically conductive material.

28. The method according to claim 20, wherein the electrode layer deposited on the barrier layer is formed from aluminum.

29. The method according to claim 20, wherein the tube elements applied on the electrode layer and contact-connected thereto are provided as carbon nanotubes.

30. The method according to claim 20, wherein the carbon nanotubes applied on the electrode layer and contact-connected thereto are provided by growth nuclei comprising ink.

31. The method according to claim 20, wherein the carbon nanotubes applied on the electrode layer and contact-connected thereto are formed from growth nuclei of $Fe(NO_3)_3 * 9H_2O$ ink.

32. The method according to claim 20, wherein the tube elements are coated with a metallization layer.

33. The method according to claim 20, wherein growth nuclei for the carbon nanotubes that are to be applied on the electrode layer and contact-connected thereto are applied by a stamp device.

34. The method according to claim 33, wherein the stamp device is provided as a plastic stamp made of polydimethylsiloxane.

35. The method according to claim 33, wherein a stamp structure of the stamp device is provided by electron beam lithography.

36. The method according to claim 20, wherein the filling material for filling the space between the tube elements is formed by an electrically conductive material.

37. The method according to claim 36, wherein the filling material for filling the space between the tube element is provided from polysilicon.

38. The method according to claim 20, wherein the dielectric coating with which the tube elements are coated is formed from a material having a high relative permittivity.

39. The method according to claim 20, wherein the dielectric coating with which the tube elements are coated is provided from aluminum oxide.

40. The method according to claim 20, wherein the counter-electrode connected to the filling material is put at ground potential.

41. The method according to claim 20, wherein the tube elements applied on the electrode layer and contact-connected thereto are oriented such that they have an axis of symmetry that is perpendicular to the electrode layer.

42. The method according to claim 20, wherein the carbon nanotubes that are formed from growth nuclei and are to be applied on the electrode layer and contact-connected thereto are deposited by a chemical vapor deposition method.

43. The method according to claim 36, wherein the electrically conductive material from which the filling material for filling the space between the tube elements is formed is provided by a titanium nitride.

* * * * *